(12) United States Patent
Kim et al.

(10) Patent No.: US 6,294,398 B1
(45) Date of Patent: Sep. 25, 2001

(54) METHOD FOR PATTERNING DEVICES

(75) Inventors: Changsoon Kim, Princeton; Paul E. Burrows, Princeton Junction; Stephen R. Forrest, Princeton, all of NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 09/447,793

(22) Filed: Nov. 23, 1999

(51) Int. Cl.[7] .................................................. H01L 12/00
(52) U.S. Cl. .................. 438/22; 438/23; 438/34; 438/35; 438/99; 257/40; 257/79; 257/88
(58) Field of Search .................. 438/22, 23, 34, 438/35, 99; 257/40, 88, 79

(56) References Cited

U.S. PATENT DOCUMENTS

| 5,641,611 | 6/1997 | Shieh et al. . |
| 5,707,745 | 1/1998 | Forrest et al. . |
| 5,925,259 | 7/1999 | Biebuyck et al. . |
| 6,013,538 | 1/2000 | Burrows et al. . |
| 6,027,630 | 2/2000 | Cohen . |

FOREIGN PATENT DOCUMENTS

WO 96/19792  6/1996 (WO) .

OTHER PUBLICATIONS

Co-pending U.S. application Serial No. 09/182,636, filed Oct. 30, 1998, entitled "Method for Patterning Devices".

*Primary Examiner*—Long Pham
(74) *Attorney, Agent, or Firm*—Kenyon & Kenyon

(57) ABSTRACT

The present invention relates to patterning methods for organic devices, and more particularly to patterning methods using a die. The method includes depositing a first layer of organic materials over a substrate; depositing a second layer of an electrode material over the first layer of organic materials; pressing a patterned die having a raised portion onto the second layer; and removing the patterned die. Preferably the patterned die is coated with a metal. Optionally the method includes depositing additional layers over the substrate prior to pressing the patterned die.

11 Claims, 10 Drawing Sheets

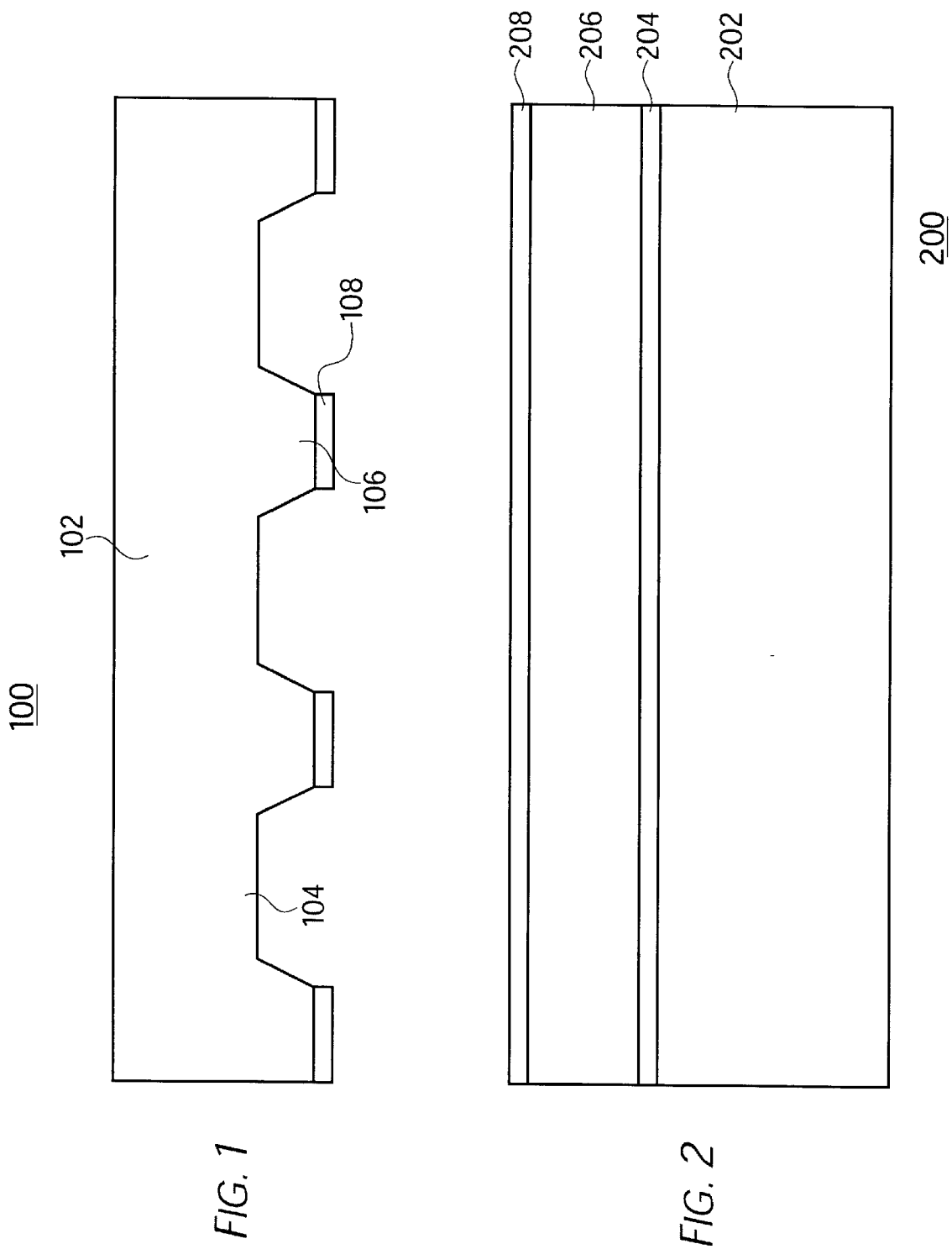

METHOD FOR PATTERNING DEVICES

FIELD OF THE INVENTION

The present invention relates to patterning methods for thin films, and more particularly to patterning methods using a die.

BACKGROUND OF THE INVENTION

Organic light emitting devices (OLEDs), which make use of thin films that emit light when excited by electric current, are becoming an increasingly popular technology for applications such as flat panel displays. Popular OLED configurations include double heterostructure, single heterostructure, and single layer, as described in PCT Application WO 96/19792, which is incorporated herein by reference.

To form an array of OLEDs, the constituent materials must be patterned. Such patterning may be achieved by photoresist methods, as disclosed by U.S. Pat. No. 5,641,611 to Shieh, and in U.S. patent application Ser. No. 08/977,205 now U.S. Pat. No. 6,013,538. Shadow masks may also be used to pattern, as disclosed by co-pending U.S. patent application Ser. No. 09/182,636. Shadow masks must be thick enough to provide mechanical strength and thus, the obtainable resolution of the pattern is limited. Other methods of patterning have been used, such as excimer laser ablation and conformal masks.

While these known patterning methods are acceptable in certain circumstances, a more accurate, faster and less expensive method of patterning is desirable.

SUMMARY OF THE INVENTION

A method of fabricating a device is provided. The method includes depositing a first layer of organic materials over a substrate; depositing a second layer, which is an electrode, over the first layer; pressing a patterned die having a raised portion onto the second layer; and removing the patterned die. Additionally, a third layer may be deposited between the substrate and the second layer. The third layer is preferably an electrode.

BRIEF DESCRIPTION OF THE DRAWINGS

FIG. 1 shows a cross-section of a die adapted for use with the present invention.

FIG. 2 shows a cross-section of a sample prior to patterning in accordance with the present invention.

FIG. 8(a) is the magnified image of the square area in FIG. 8(b).

DETAILED DESCRIPTION

Figure 3:
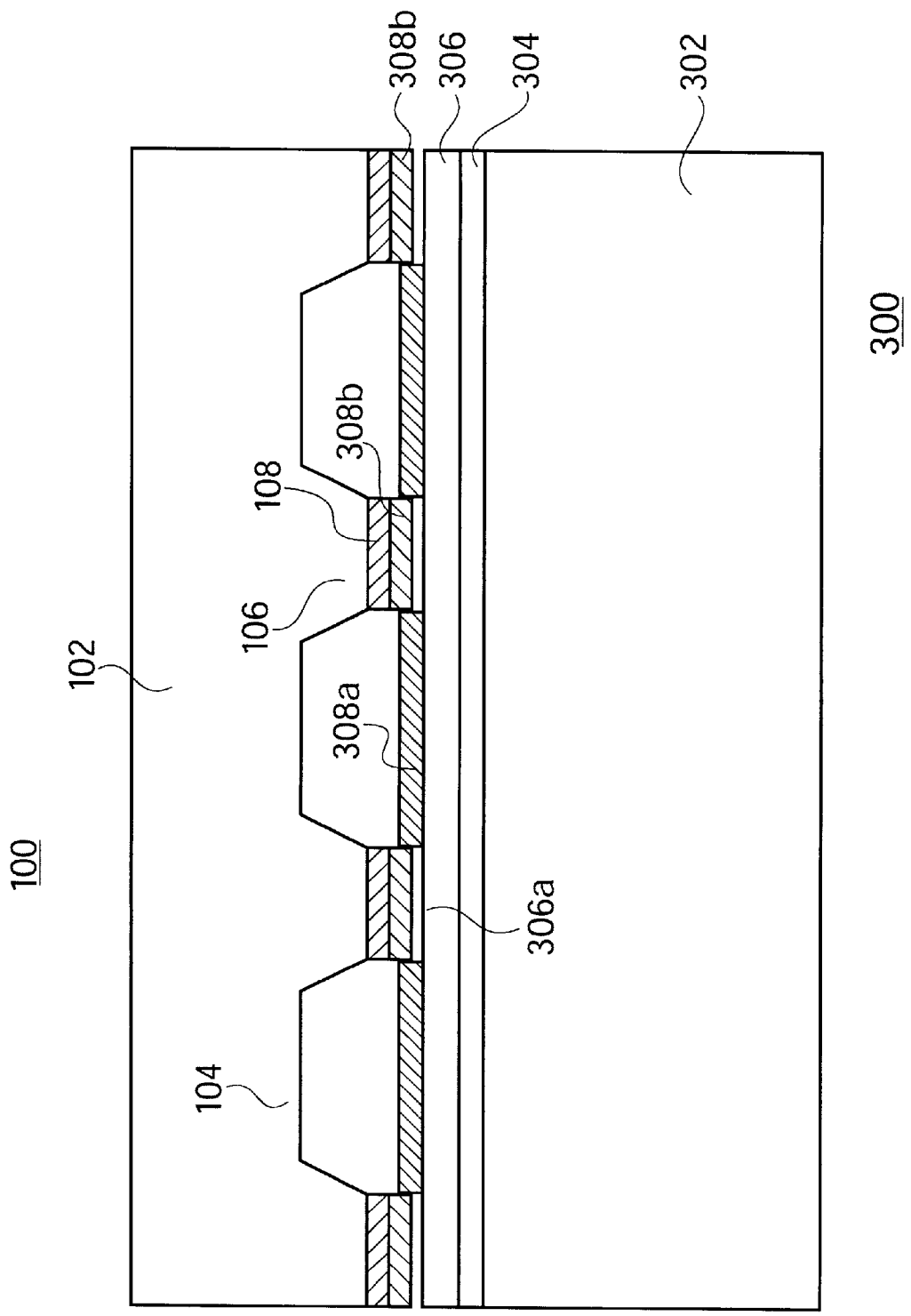
FIG. 3 shows a cross-section of the die of FIG. 1 being used to pattern a sample similar to that of FIG. 2.

The present invention will be described with reference to the illustrative embodiments in the following processes and drawing figures.

A method is provided for patterning an electronic device using a die. The device is fabricated on top of a substrate. Prior to patterning in accordance with the present invention, patterned layers or a first electrode may be formed on the substrate using techniques known to the art. Then, a blanket layer of organic material is deposited over the substrate and any patterned layers or electrodes present thereon. Next, a blanket layer of a metal electrode material (the "top electrode layer"), is deposited over the organic layer. The top electrode layer may be for example, a cathode layer or an anode layer. The optional first electrode may also be a cathode layer or an anode layer. Preferably if the top electrode layer is a cathode layer, then the first electrode is an anode layer and vice versa.

The electronic device may be for example an Organic Light Emitting Device (OLED) as described for example in U.S. Pat. No. 5,707,745, which is incorporated herein by reference.

The blanket layers are patterned with a die having raised and depressed portions that form a desired pattern. According to one embodiment, the die is pressed onto the blanket layers, such that the raised portions of the die compress underlying layers on the substrate. As a result, the organic layers will deform, and the top electrode layer will break at the juncture between the raised and depressed portions of the die. The raised portions of the die may be coated with a material such that the underlying portions of the top electrode layer stick to the die, and are removed when the die is lifted away. When the raised portions of the die are not coated with a material such that the underlying portions of the top electrode layer stick to the die, the compression by the die causes the top electrode layer to break, however, the residual layer of the top electrode remains part of the patterned electronic device.

The die is formed from a hard substance. Preferably, the die is made of a substance that is readily patterned. Examples of suitable materials that may be used to form dies in accordance with the present invention include silicon, glass, quartz and hard metals.

FIG. 1 shows a cross-section of a die 100 adapted for use with the present invention. Die 100 has a body 102, formed of a hard substance. Body 102 has depressed portions 104 and raised portions 106. Depressed portions 104 and raised portions 106 may be formed using techniques known to the art, such as silicon patterning and etching processes. Raised portions 106 are coated with a coating 108. Coating 108 is adapted to adhere well to body 102. Coating 108 is also adapted to adhere well to materials such as metal and indium tin oxide (ITO). For example, coating 108 may be a metal or other pressure sensitive adhesive. In particular, if a metal is used, it should be of the same of approximately the same composition as the metal to be lifted off of the organic surface. On compression, these similar metals form a strong cold-welded bond.

FIG. 2 shows a cross-section of a sample 200 prior to patterning in accordance with the present invention. Sample 200 has a substrate 202 made of a material adapted to provide support. Preferably, substrate 202 is made of a material such as glass or plastic. A bottom electrode 204, made of a conductive material, is deposited onto substrate 202 using techniques known to the art. Preferably, bottom electrode 204 is made of a transparent conductive material, such as ITO. In one embodiment the bottom electrode 204 may be patterned into strips, as discussed in further detail with reference to FIG. 4, using techniques known to the art. Organic layer 206 is blanket deposited over bottom electrode 204. Organic layer 206 may comprise a single layer or a plurality of layers. For example, organic layer 206 may comprise the multiple organic layers of a single or double heterostructure OLED, as described in U.S. Pat. No. 5,707,745, and which is incorporated by reference. Top electrode layer 208 is blanket deposited over organic layer 206. Top electrode layer 208 is made of a conductive material such as a metal, a metal alloy or ITO.

FIG. 3 shows a cross-section of die 100 of FIG. 1 being used to pattern a sample 300 similar to sample 200 of FIG. 2 into an array of OLEDs. Substrate 302, bottom electrode 304, organic layer 306 (comprising regions 306a and 306b) and top electrode layer 308 (comprising top electrode 308a and region 308b) of FIG. 3 correspond to substrate 202, bottom electrode 204, organic layer 206 and top electrode layer 208 of FIG. 2.

Die 100 is pressed onto sample 300, and raised portions 106 of die 100 contacts the upper portion of sample 300. Regions 308b of top electrode layer 308 stick to coating 108, and are removed when die 100 is lifted away from sample 300. Top electrode 308a (the remaining portion of top electrode layer 308) does not stick to the die.

Figure 4:
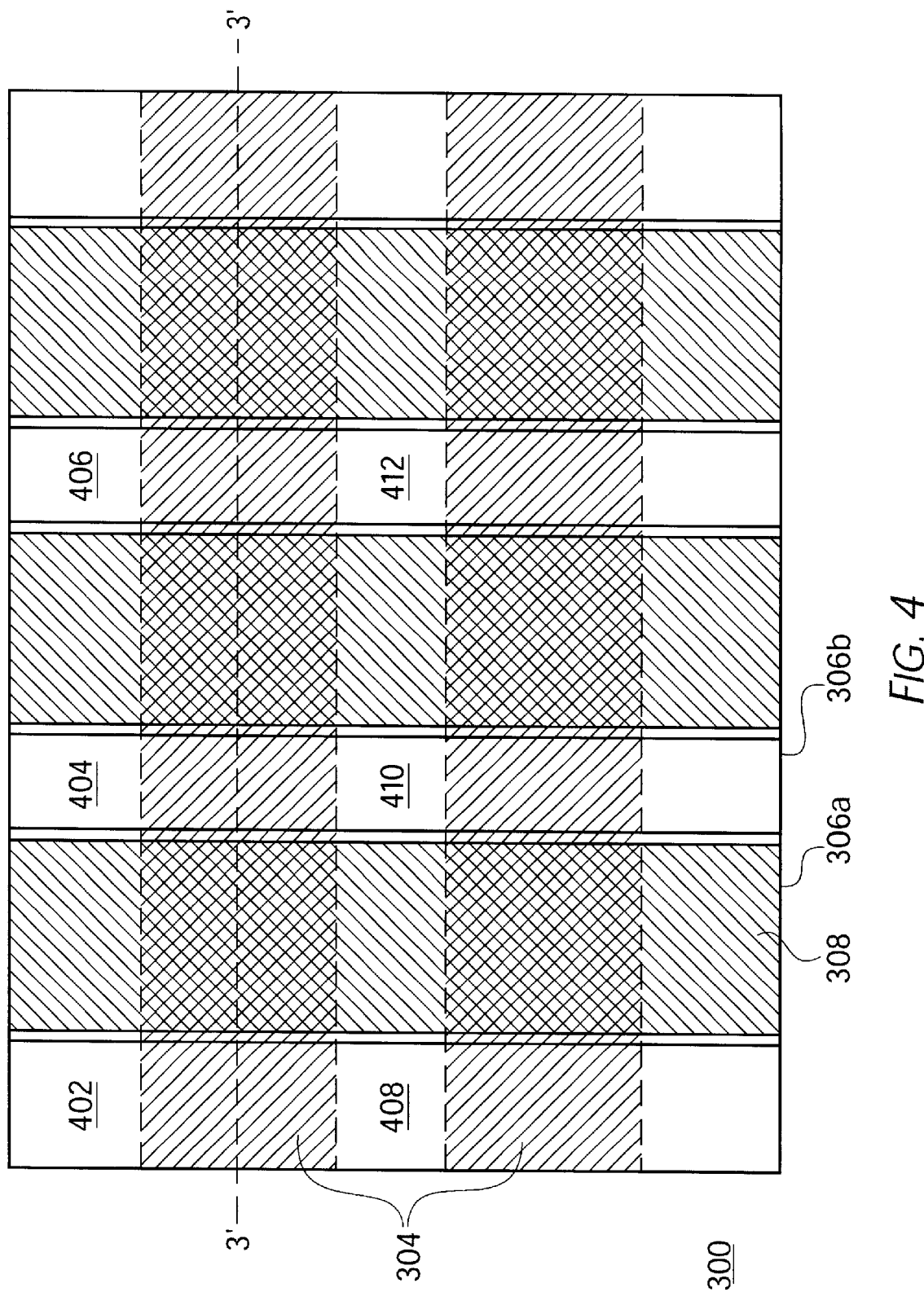
FIG. 4 shows a plan view of the sample of FIG. 3 after patterning.

FIG. 4 shows one of many possible different plan views of sample 300 after patterning as described with reference to FIG. 3. In FIG. 4, a passive display is being formulated. In particular, FIG. 3 is a cross-section of FIG. 4 through line 3'. Bottom electrodes 304 are patterned into strips using techniques known to the art, prior to the deposition of organic layer 306 and top electrode layer 308, and prior to the compression of sample 300 by die 100. After compression, top electrode layer 308 has been patterned to form top electrodes 308a. Regions 306a are exposed because regions 308b of top electrode layer 308 have been removed by die 100.

In one embodiment of the invention, Sample 300 as shown in FIG. 4 forms a 3×2 array of electronic devices. In particular, electronic devices 402, 404, 406, 408, 410 and 412 have been fabricated at the intersection of bottom electrodes 304 with top electrodes 308a. Each of these electronic may be independently addressed by controlling the voltages of bottom electrodes 304 and top electrodes 308a, using passive matrix addressing techniques known to the art.

It is to be understood that the present invention may be used to fabricate much larger arrays of organic devices than those specifically described herein. Moreover, a multi-color display may be fabricated by depositing various down-conversion layers known to the art. For example, organic layer 206 may be made of a material that emits blue light, and patterned blue-to-green and blue-to-red down conversion layers may be deposited on substrate 202 prior to the deposition of bottom electrodes 204. These down-conversion layers may be patterned such that an array of organic devices ultimately fabricated forms an array of three-color pixels, where each pixel comprises three organic devices—one with no down conversion layer that emits blue, one with a blue-to-green down conversion layer that emits green, and one with a blue-to-red down conversion layer that emits red.

EXAMPLES

A method according to the present invention for the direct micropatterning of OLED displays by post-deposition stamping was performed. Specifically an unpatterned OLED was patterned such that a cathode layer of the OLED was selectively lifted off of an OLED by pressing a patterned silicon stamp (i.e., a die) with a metal layer, onto the unpatterned OLED. In this post-deposition stamping method, the stamp contained a metal coating, which cold welded to the cathode of the unpatterned OLED when the metal coating and the cathode were contacted with one another. When the stamp was removed from the OLED, the cathode was selectively removed from the OLED in essentially the same pattern in which the metal was placed on the stamp.

Figure 5:
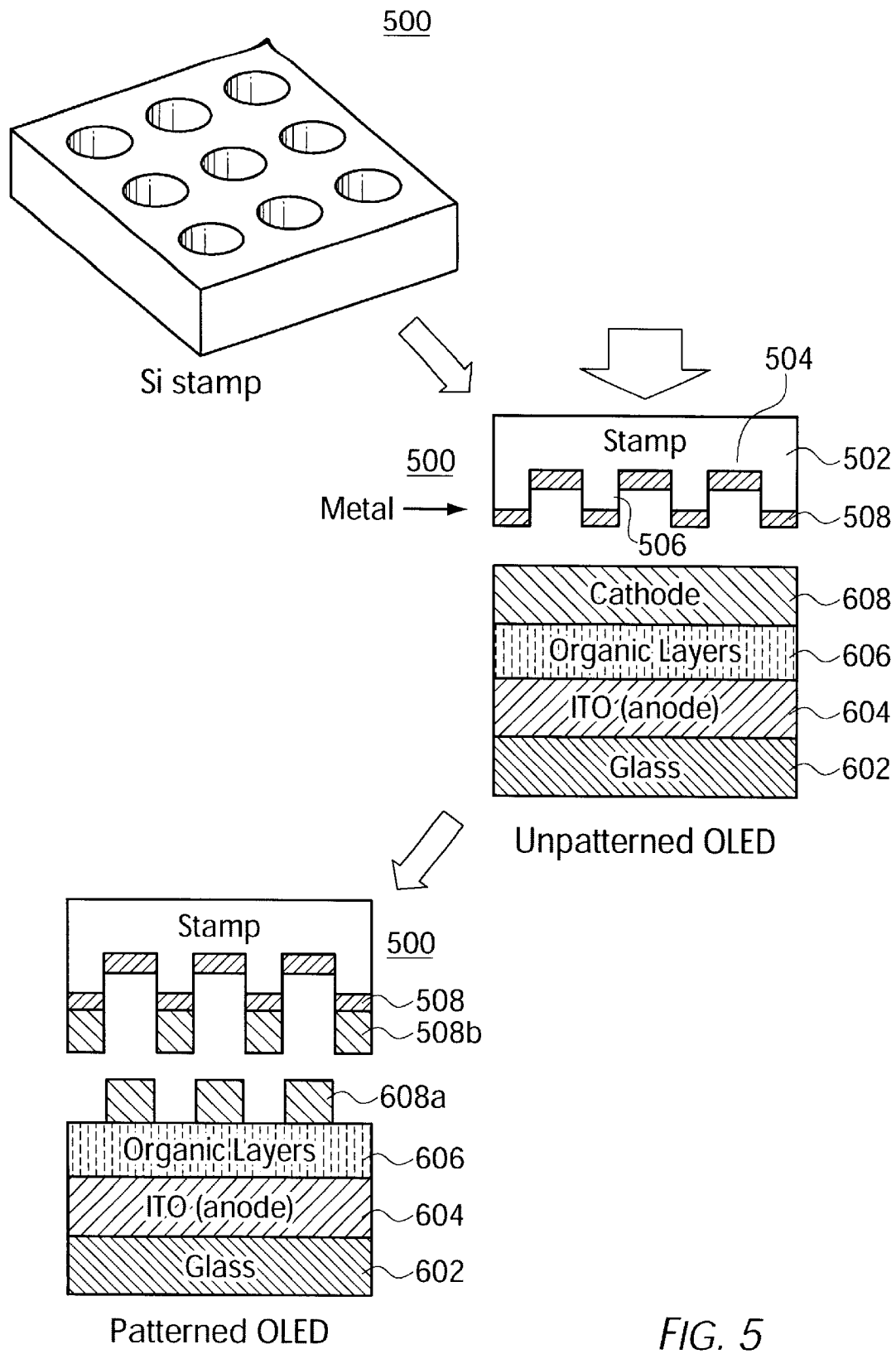
FIG. 5 shows a patterning process by cold welding followed by lift-off as set forth in the examples, where silicon stamps having a metal layer are pressed onto unpatterned OLEDs to obtain patterned OLEDs.

In the present examples, a patterning process as shown in FIG. 5 was used. First, an unpatterned small molecule OLED structure having an anode 604, one or more organic layers 606 and a cathode 608 was vacuum deposited over the entire substrate area 602. Prior to film deposition, the glass substrate 602 was precoated with ~1500 Å thick, transparent, conductive (20 $\Omega/\square$) indium tin oxide (ITO) anode was cleaned, followed by 2 minutes of oxygen plasma treatment (31 W RF power, 50 sccm oxygen flow rate, 100 mTorr chamber pressure). The OLED was a single heterostructure device having a 500 Å thick hold transport layer of 4,4'-bis[N-(1-napthyl)-N-phenyl-amino]biphenyl($\alpha$-NPD) as hole transport material and a 500 Å thick electron transport and light emitting layer of tris-(8-hydroxyquinoline)aluminum ($Alq_3$) as both electron transport and light emitting material. The cathode consisted of a 400 Å thick Mg:Ag alloy cathode capped with a 300 Å thick Ag layer.

To pattern the OLEDs, a stamp (or die) 500 was formed. In forming the stamp, a silicon wafer was processed using conventional photolithography. Using $SiO_2$ as a mask, the wafer was etched by chlorine-based reactive ion etching (RIE) by wet etching ($HF$—$HNO_3$—$CH_3COOH$ mixture etching). For wet etching, an etchant composition (by volume) of 7%:70%:23% ($HF:HNO_3:CH_3COOH$) was used and the etch rate was ~2 $\mu$m/min. The resulting pattern on the silicon stamp was the negative image of a desired OLED pattern. The silicon stamp 702 was coated with a metal coating 708 having a 50 Å thick Cr adhesion layer and a 150 Å~200 Å thick Ag layer, which was deposited by conventional e-beam evaporation.

To create the OLED pattern, the stamp was pressed onto the unpatterned OLEDs to induce cold welding between the OLED cathode and the silver on the stamp. The pressing was performed using an Instron Dynamic Testing System (model 8501), which applies force using a hydraulic actuator. The substrate and the stamp were placed on a lower cylinder-shaped platen and compressive force was applied by moving up the lower platen to a fixed upper platen. The applied force increased from zero to maximum linearly with respect to time, and the maximum force and ramp rate were computer controlled. Throughout the experiment, glass substrates 602 having a size of about 10 mm×10 mm were used.

Figure 6A:
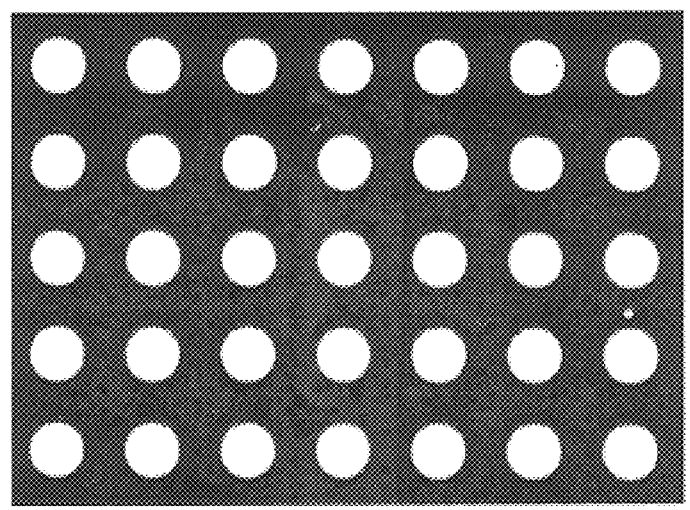
FIGS. 6A and 6B shows optical micrographs of a 230 $\mu$m diameter dots pattern.
Figure 6B:
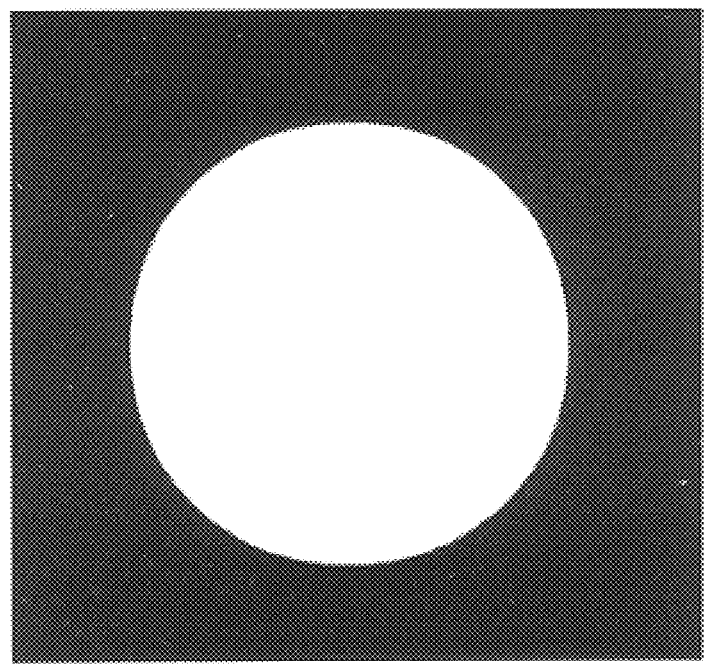

The results for a 230 $\mu$m diameter dots pattern are shown in FIGS. 6a and 6b. The ITO layer was not patterned and the maximum force of the pressing was ~35 kN, corresponding to an average pressure of ~290 MPa. The ramp rate was 1 kN/s and the sample was kept under pressure for 5 minutes after the maximum force was reached. Silicon stamps with an etched depth of ~10 $\mu$m were used. This depth was chosen to try and prevent possible unintentional contact of the stamp to the cathode layer due to the possible deformation of the glass substrate. This consideration is particularly important with regard to larger patterns. As shown in FIGS. 6a and 6b, a pattern transfer with high yield was achieved.

Figure 7:
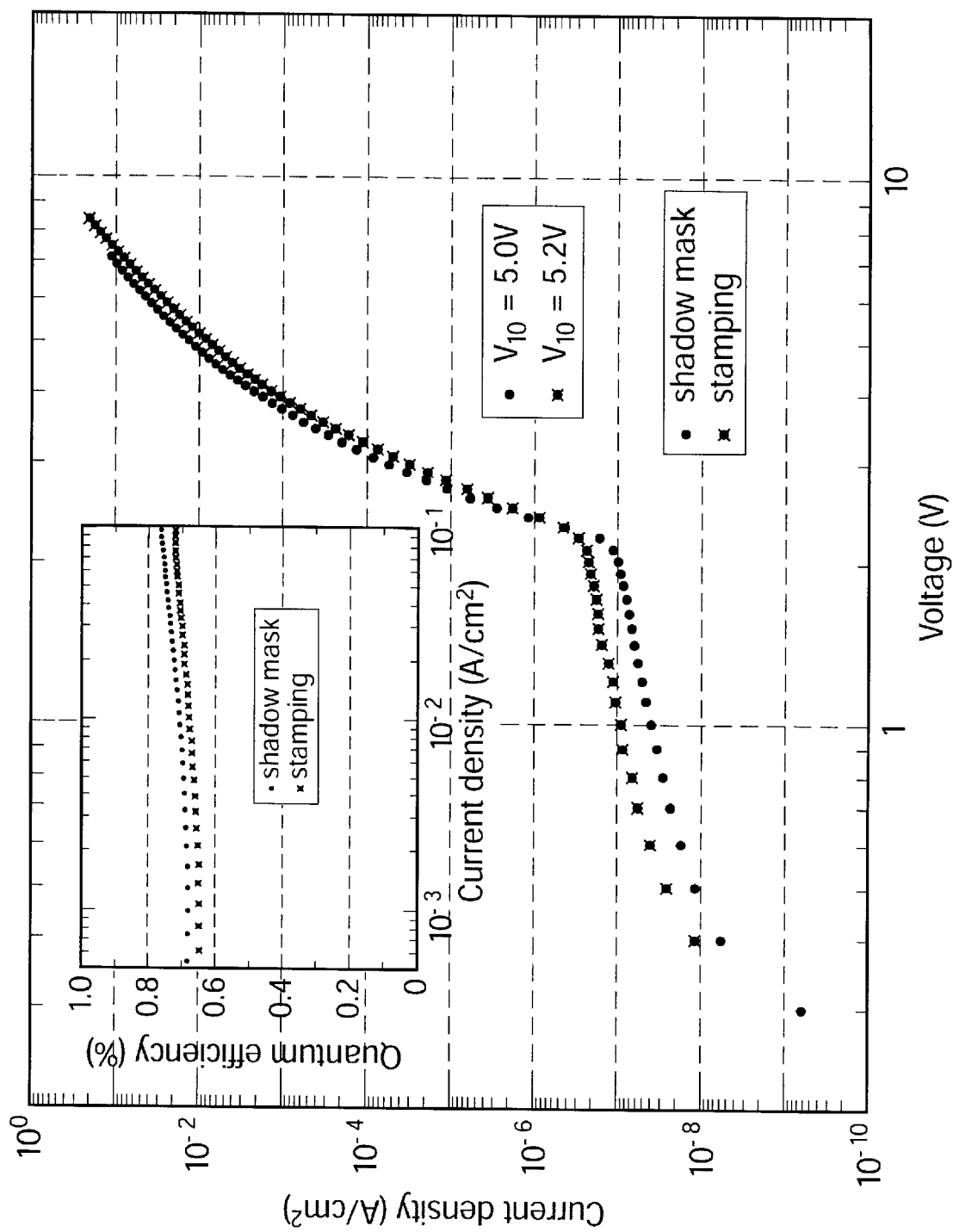
FIG. 7 shows the results of a comparison of OLEDs patterned by a shadow masking technique and OLEDs patterned by the stamping technique of the present invention, as measured by current density vs. voltage characteristics and by quantum efficiency vs. current density.

FIG. 7 compares the 1 mm diameter OLEDs patterned by the present technique with OLEDs patterned using a conventional shadow mask technique. Current density versus voltage (J-V) and external quantum efficiency versus current density are shown in FIG. 7. $V_{10}$ is defined as voltage corresponding to current density of 10 mA/cm$^2$. FIG. 7 shows that no apparent degradation was induced by this method.

Figure 8A:
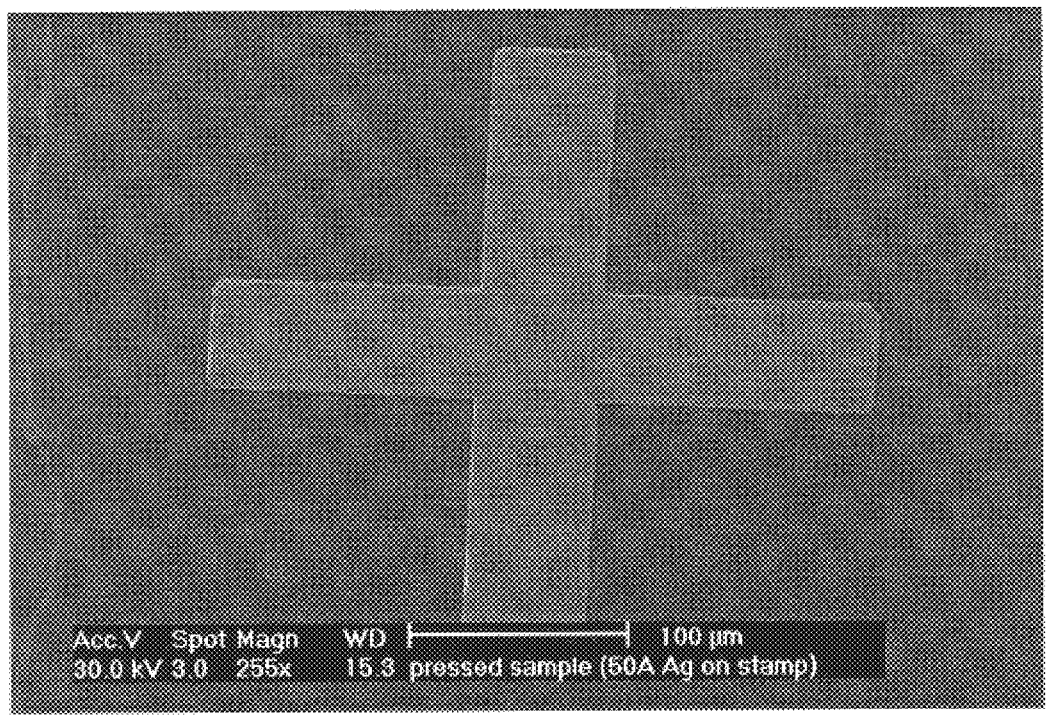
FIGS. 8A and 8B shows SEM images of the cross pattern with a width of 55 $\mu$m.
Figure 8B:
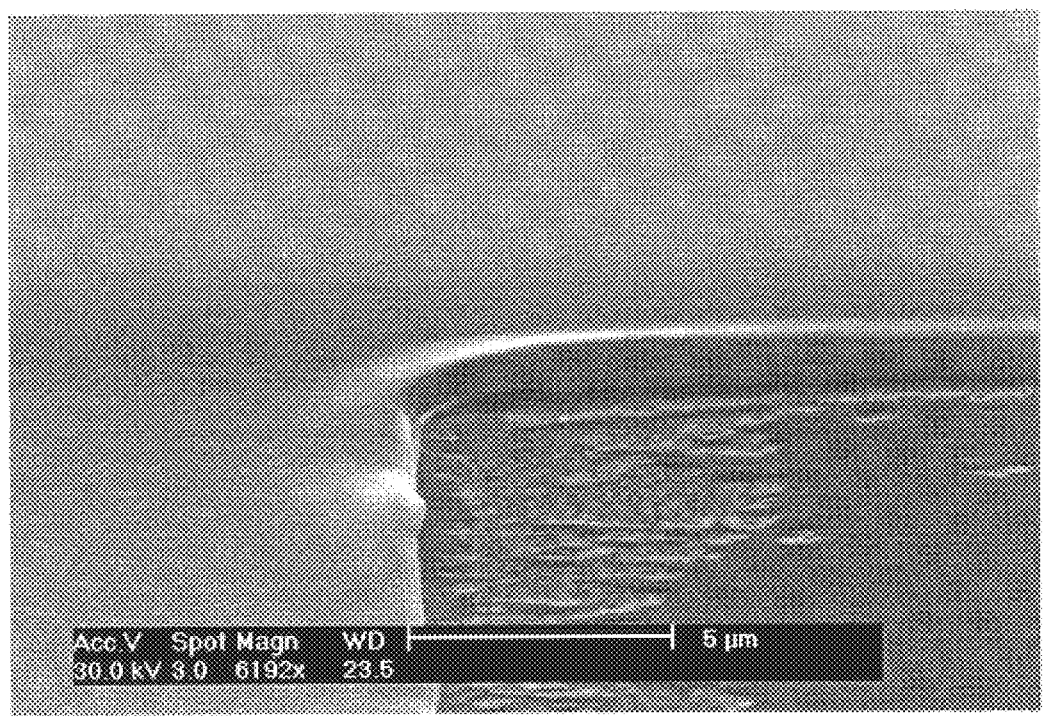

FIGS. 8a and 8b show a cross pattern with a width of 55 $\mu$m obtained by the present method. There was no significant peel-off of the cathode. It is noted that some of the organic materials were also removed.

The patterning of the OLEDs in these experiments were performed in ambient laboratory conditions, hence neither the stamps nor the OLEDs were protected from dust, oxygen, water vapor, etc.

Figure 9A:
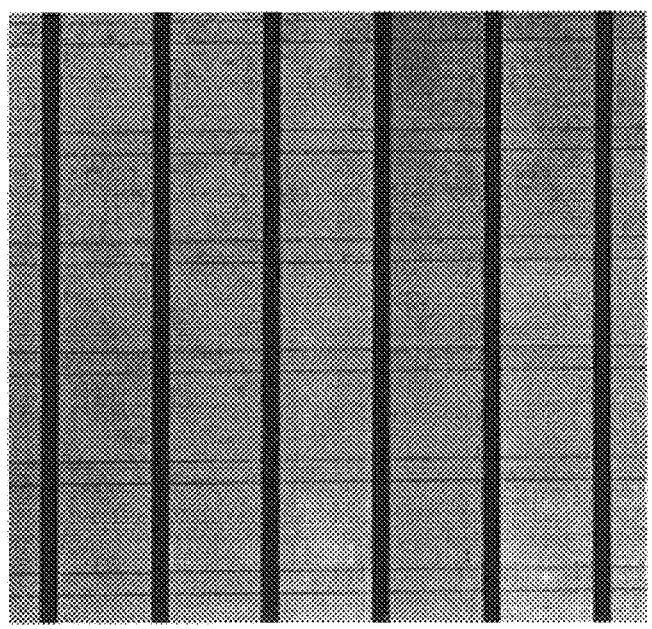
FIGS. 9A and 9B shows optical micrographs of the passive matrix with 420 $\mu$m×420 $\mu$m pixels.
Figure 9B:
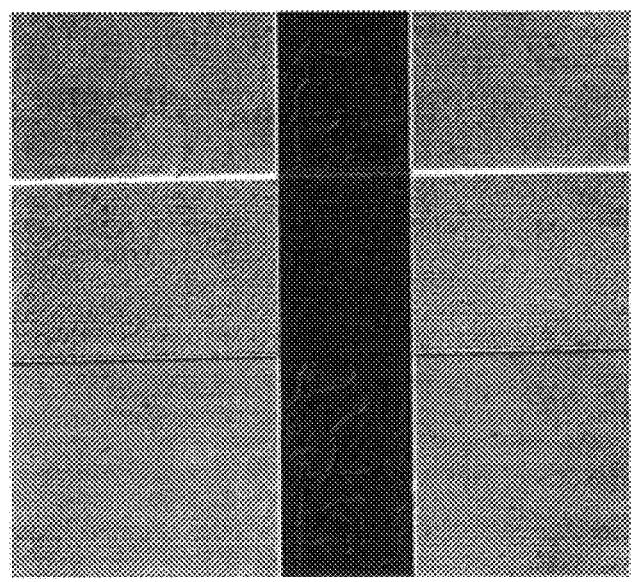
Figure 10A:
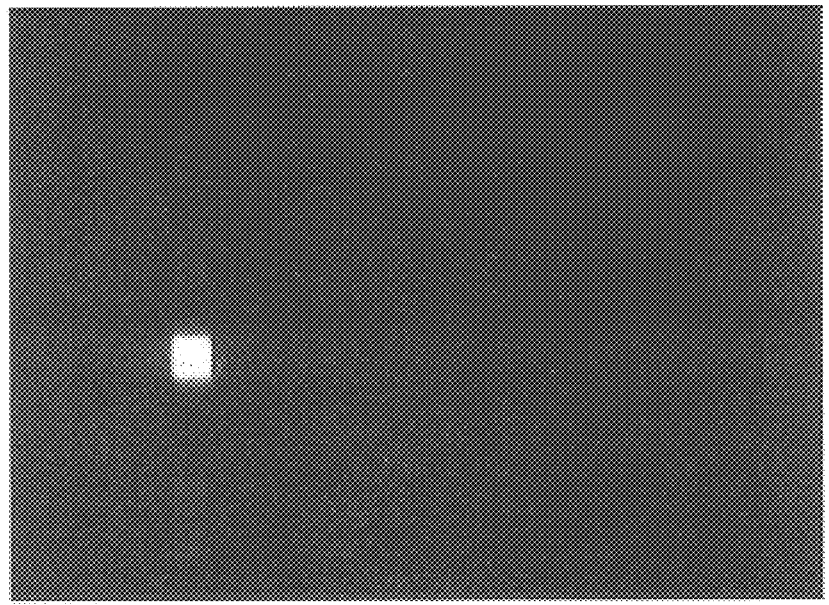
FIGS. 10a and b shows CCD camera images of electroluminescence from single and multiple pixels.
Figure 10B:
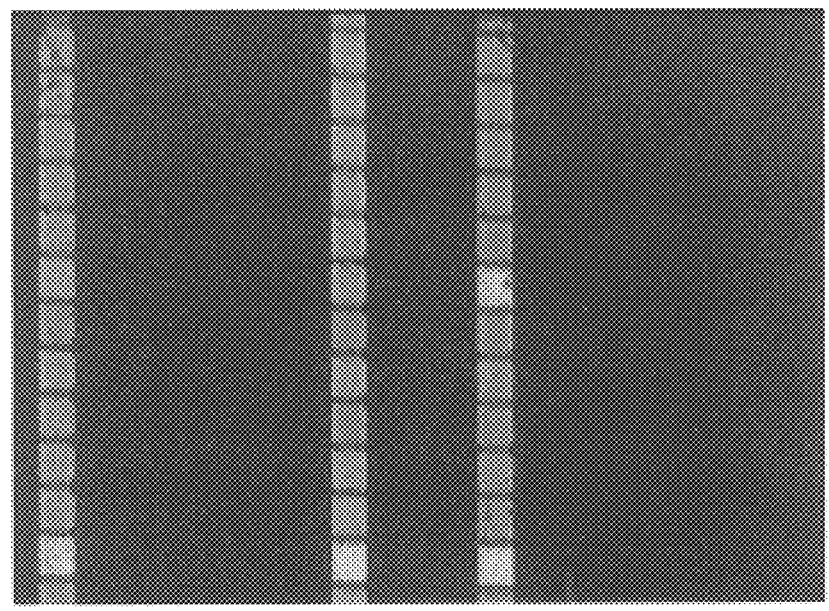

To demonstrate a possible application of the present method to flat panel displays, a passive matrix having a pixel size of 420 $\mu$m×420 $\mu$m was fabricated. First, parallel lines of a ~1500 Å thick ITO layer were obtained by conventional photolithography and wet etching. After performing a cleaning step, organic single heterostructure and cathode layers were subsequently deposited on the patterned ITO layer (as described above). Next the substrate was pressed perpendicularly with the stamp with a parallel line pattern to obtain a passive matrix. The maximum force applied during the pressing was ~8 kN (i.e., a pressure of ~380 MPa) and the ramp rate was 1 kN/s. The sample was kept under pressure for 5 minutes after the maximum pressure was reached. FIGS. 9a and 9b show the achieved pattern. FIGS. 10a and 10b show CCD camera images of the individually and multiply turned on pixels respectively. For the individually turned on pixel in FIGS. 10a and 10b, the whole column and the whole row were faintly turned on. However, this is believed to be due to reverse leakage current, a problem inherent to the devices.

As two solid surfaces (e.g., the metal layer on the stamp and the cathode of the OLED) are brought into contact, they can be bonded to each other when the interfacial separation is decreased below a critical value, resulting in a single solid. Therefore, to achieve good patterns by this technique, the applied pressure should be high enough to decrease the interfacial separation below the critical value.

The stress distribution in the cathode layer should also be considered. Due to the relatively high applied pressure, plastic deformation of the cathode and organic layers should be taken into consideration. This problem may be considered an elastic contact problem between the silicon stamp and the glass substrate with finite friction. Normal contact stress is very large at the edge of the contact region. It is believed that the cathode layer is locally weakened at the edge of the contact region due to the highly concentrated normal stress.

Figure 11:
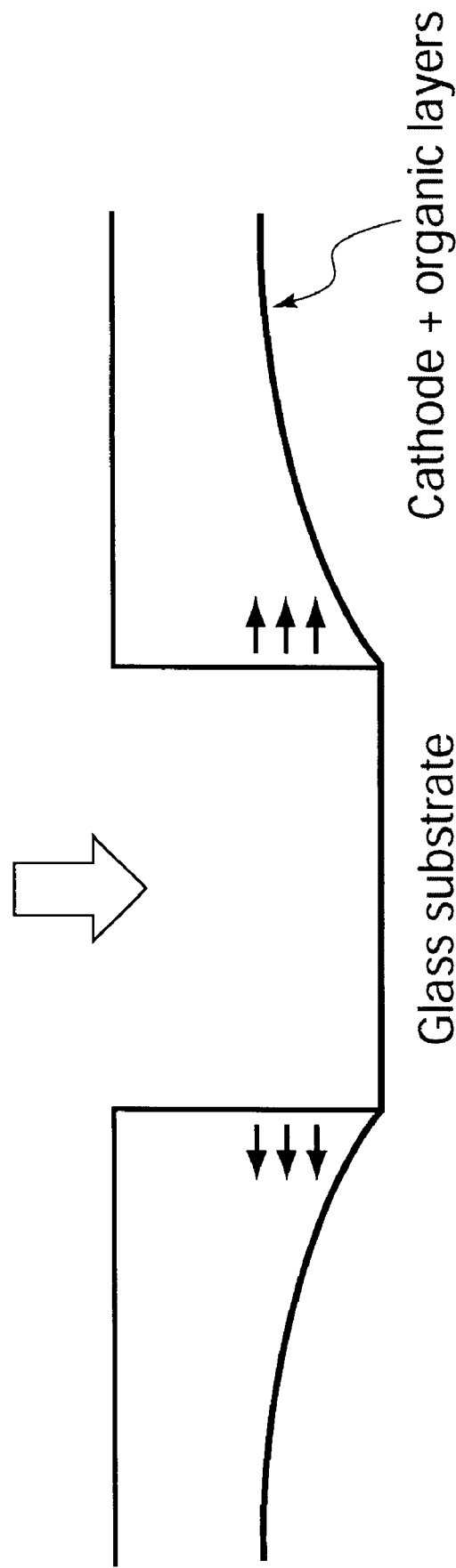
FIG. 11 is a schematic diagram showing elastic deformation of the glass substrate and lateral expansion of the raised part of a stamp.

As applied pressure increases gradually, the raised part of the stamp expands laterally as determined by the applied pressure and poisson ratio. See FIG. 11. This is expected to help local weakening. Therefore, as a result, the fracture along the weakened boundaries occurs upon separation of the stamps from the OLEDs, giving sharp pattern edges. The applied pressure should be high enough to decrease the interfacial separation of silver layers below the critical value and also to induce the local weakening of the metal layers along the edges of the contact region. An optimum pressure was determined to be about 250 MPa to about 400 MPa.

Conclusion

The method of the present invention has several advantages over previously reported patterning techniques. For example, the present method is very cost-effective, because the stamps are reusable. In embodiments where the stamps have metal layers, the stamps are reusable after the metal layers are removed by wet etching. The method of the present invention also offers high throughput. Large areas, such as display panels, can be patterned in one step.

Additionally, the method of the present invention is well suited for roll-to-roll fabrication processes that use flexible plastic substrates. By using roller stamps, large area patterning can be performed more easily for flexible substrates, since optimum pressure can be applied with smaller forces due to decreased contact areas. The method of the present invention allows simple, cost-effective and high throughput fabrication of OLEDs and other electronic devices and can be applied to the fabrication of flat panel displays, for example.

While the present invention is described with respect to particular examples and preferred embodiments, it is understood that the present invention is not limited to these examples and embodiments. In particular, the present invention is not limited to OLEDs, and may be applied to a wide variety of electronic devices. In addition, with respect to OLEDs, the present invention is not limited to the particular examples and embodiments described. The present invention as claimed therefore includes variations from the particular examples and preferred embodiments described herein, as will be apparent to one of skill in the art.

What is claimed is:

1. A method of fabricating an organic device, comprising
    (a) depositing a first layer comprising organic materials over a substrate;
    (b) depositing over said first layer a second layer comprising an electrode material;
    (c) pressing a patterned die having a raised portion onto the second layer; and
    (d) removing the patterned die.
2. The method of claim 1, wherein the patterned die comprises silicon.
3. The method of claim 1, wherein the patterned die has a raised portion that is coated with an adhesive material.
4. The method of claim 3, wherein the adhesive material comprises at least one metal.
5. The method of claim 3, wherein the adhesive material comprises glue.
6. The method of claim 1, wherein a third layer is deposited over the substrate prior to depositing a first layer.
7. The method of claim 6, wherein the third layer is patterned prior to depositing a first layer.
8. The method of claim 6, wherein the method is used to fabricate a passive array of organic light emitting devices, each device having a bottom electrode formed from the third layer, an organic light emitting layer formed from the first layer, and a top electrode formed from the second layer.
9. The method of claim 6, wherein the third layer comprises an electrode material.
10. The method of claim 9, wherein the third layer is selected from the group consisting of metals and metal oxides.
11. The method of claim 1, wherein the second layer is selected from the group consisting of metals and metal oxides.

* * * * *